United States Patent [19]
Loh et al.

[11] Patent Number: 5,650,919
[45] Date of Patent: Jul. 22, 1997

[54] APPARATUS INCLUDING A PEAK SHAPED DIELECTRIC DAM

[75] Inventors: Karl I. Loh, E. Hanover, N.J.; Chang Hoon Lee, Kyungki-Do, Rep. of Korea

[73] Assignees: Zymet, Inc., E. Hanover, N.J.; Samsung Display Devices Co., Ltd., Kyungki-Do, Rep. of Korea

[21] Appl. No.: 604,356

[22] Filed: Feb. 21, 1996

Related U.S. Application Data

[63] Continuation of Ser. No. 321,869, Oct. 14, 1994, abandoned.

[51] Int. Cl.$^6$ ............................. H05K 7/02; H01R 13/40
[52] U.S. Cl. ...................... 361/779; 174/117 A; 439/66; 439/91; 439/591; 361/760; 361/770
[58] Field of Search ........................ 174/88 R, 117 A; 257/746, 753, 747, 723, 724; 156/310; 439/66, 91, 591; 427/96; 437/215; 361/767, 769, 771, 779, 760, 772, 749, 773, 774, 777, 782, 783, 770; 228/180.21, 180.22

[56] References Cited

U.S. PATENT DOCUMENTS

| | | | |
|---|---|---|---|
| 4,667,401 | 5/1987 | Clements et al. | 29/832 |
| 4,731,282 | 3/1988 | Tsukagoshi et al. | 428/220 |
| 4,740,657 | 4/1988 | Tsukagoshi et al. | 174/88 R |
| 4,963,002 | 10/1990 | Tagusa et al. | 350/336 |
| 5,001,542 | 3/1991 | Tsukagoshi et al. | 257/724 |
| 5,120,665 | 6/1992 | Tsukagoshi et al. | 437/205 |
| 5,196,371 | 3/1993 | Kulesza et al. | 437/209 |
| 5,258,577 | 11/1993 | Clements | 361/779 |

FOREIGN PATENT DOCUMENTS

| | | | |
|---|---|---|---|
| 5-72551 | 3/1993 | Japan | 361/749 |

OTHER PUBLICATIONS

"Chip–On Glass Packaging Technology Using Conductive Particles" H. Otsuki, et al, IMC 1992 Proceedings, Jun. 5, 1992.

*Primary Examiner*—Donald Sparks

[57] ABSTRACT

An apparatus, comprising a first member, including two conductive paths, a conductive adhesive, a second member, including two conductive paths, each of the two conductive paths of the second member being connected to a corresponding one of the two conductive paths of the first member via the conductive adhesive, to form two electrical connections, and a peak-shaped dielectric dam, formed on the second member between the two electrical connections.

16 Claims, 3 Drawing Sheets

APPARATUS INCLUDING A PEAK SHAPED DIELECTRIC DAM

This application is a continuation of application Ser. No. 08/321,869 filed on Oct. 14, 1994, now abandoned.

The present invention relates to an apparatus including a peak-shaped dielectric dam and a method of manufacturing the peak-shaped dielectric dam.

BACKGROUND OF THE INVENTION

In an electronic device 10, an integrated circuit 12 is attached to a substrate 14, which may be made of glass, as illustrated in FIG. 1. The integrated circuit 12 includes aluminum pads 16, gold bumps 18, and a passivation layer 20. The substrate 14 includes patterns 22, which are electrically connected to the gold bumps 18 of the integrated circuit 12 via conductive particles 24 contained in an adhesive 26. The conductive particles 24 may be made of gold, silver, nickel, metal coated glass, metal coated silica, or a metal coated polymer. The conductive particles 24 in the adhesive 26 are trapped between the patterns 22 on the substrate 14 and the gold bumps 18 on the integrated circuit 12 to make electrical connections 28 therebetween. However, the conductive particles 24 may also form a short circuit 30 between a first electrical connection 32 and a second electrical connection 34, thereby causing a short circuit in the electronic device 10.

One approach to solving this short circuiting problem is illustrated in FIG. 2. In this approach, the conductive particles 24 are selectively deposited onto the gold bumps 18 on the integrated circuit 12, before attaching the integrated circuit 12 to the substrate 14. The integrated circuit 12 and the substrate 14 are then attached with a non-conductive paste 36. This method is extremely expensive and time consuming, since it is very difficult to place the conductive particles 24 on the gold bumps 18. Further, integrated circuits are not typically sold with conductive particles on the aluminum pads. As a result, this technique is not suitable for mass producing an electronic device, which includes numerous integrated circuits, attached to a substrate.

A second solution to the short circuit problem identified above is illustrated in FIG. 3. In this method, the substrate 14 and patterns 22 residing thereon are coated with a positive acting photoimagable photoresist 38, mixed with conductive particles 24, as illustrated in FIG. 3(a). Ultraviolet light is applied to a backside of the substrate 12 and a portion of the positive acting photoimagable photoresist 38 which is exposed (namely the portions between the patterns 22) washes away, leaving the conductive particles 24 on top of the patterns 22 of the substrate 14, as illustrated in FIG. 3(b). The substrate 14 is then attached to the integrated circuit 12 using a nonconductive adhesive 36. This technique is also time consuming and expensive, since the positive acting photoimagable photoresist 38 must be carefully applied to the patterns 22 of the substrate 12, in order to ensure that a uniform layer of conducting particles 24 are applied on top of the patterns 22 of the substrate 12. Further, this technique is impractical for large area substrates and is not easily integrated into existing manufacturing processes.

A third technique for solving the short-circuiting problem includes the addition of a dielectric barrier 40, between two patterns 12 on the substrate 14, as illustrated in FIG. 4. However, in this arrangement, the dielectric barrier 40 is likely to force the conductive particles 24, as illustrated in FIG. 4, to form a short-circuit 30 between first 42 and second 44 electrical connections.

The invention described in this specification solves the problem of short circuiting between electrical connections when using a adhesive, by providing a peak-shaped dielectric dam between the two electrical connections, in order to minimize the possibility that the conductive particles of the adhesive will form a short circuit between the two electrical connections. The present specification also discloses a novel method for manufacturing the peak-shaped dielectric dam, which is fast and inexpensive, and therefore suitable for the mass production of electronic devices, which include numerous interconnections between integrated circuits and substrates.

SUMMARY OF THE INVENTION

One object of the present invention is to create a novel arrangement for minimizing the possibility of an electrical short circuit between two electrical connections of an integrated circuit and substrate, by utilizing a peak-shaped dielectric dam between the two electrical connections. This novel design prevents conductive particles contained in an adhesive which bonds the integrated circuit to the substrate, from forming a short circuit between the two electrical connections by ensuring the conductive particles fall to either side of the peak-shaped dielectric dam. This object of the present invention is fulfilled by providing an apparatus comprising:

a first member, including two conductive paths;

a adhesive;

a second member, including two conductive paths, each of the two conductive paths of said second member being connected to a corresponding one of the two conductive paths of said first member via said adhesive, to form two electrical connections; and a peak-shaped dielectric dam, formed on said second member between said two electrical connections.

This object of the present invention is also fulfilled by providing an apparatus comprising:

a first member, including two conductive paths;

a adhesive;

a second member, including two conductive paths, each of the two conductive paths of said second member being connected to a corresponding one of the two conductive paths of said first member via said adhesive, to form two electrical connections; and peak-shaped dielectric means, formed on said second member between said two electrical connections.

Another object of the present invention is to create a novel method of electrically connecting an integrated circuit to a substrate including the peak-shaped dielectric dam, which prevents short circuiting between two electrical connections between the integrated circuit and the substrate. The method of the present invention does not require precise application of a conducting adhesive, and as a result, the method may be performed quickly and cheaply, in order to produce the peak-shaped dielectric dam, which prevents short circuiting. This object of the present invention is fulfilled by providing a method of electrically connecting a first member, including two conductive paths and a second member, including two conductive paths, said method comprising the steps of:

(a) forming a peak-shaped dielectric dam between the two conductive paths on the second member; and (b) using a adhesive to form two electrical connections between the two conductive paths of the first member and a corresponding one of the two conductive paths of the second member.

Another object of the present invention is to create a novel arrangement for minimizing the possibility of an electrical short circuit between two electrical connections of an integrated circuit and a substrate, by utilizing a sloped dielectric dam between the two electrical connections. This novel design prevents conductive particles contained in an isotropically conductive adhesive which bonds the integrated circuit to the substrate, from forming a short circuit between the two electrical connections by creating a reservoir for displaced isotropically conductive adhesive. This object of the present invention is fulfilled by providing an apparatus, comprising:

a first member, including two conductive paths;

an isotropically conductive adhesive;

a second member, including two conductive paths, each of the two conductive paths of said first member being connected to a corresponding one of the two conductive paths of said second member via said isotropically conductive adhesive, to form two electrical connections; and a sloped dielectric dam, formed between said two electrical connections.

This object of the present invention is also fulfilled by providing an apparatus, comprising:

a first member, including two conductive paths;

an isotropically conductive adhesive;

a second member, including two conductive paths, each of the two conductive paths of said first member being connected to a corresponding one of the two conductive paths of said second member via said isotropically conductive adhesive, to form two electrical connections; and sloped dielectric means, formed between said two electrical connections, for electrically isolating said two electrical connections by creating a reservoir for displaced isotropically conductive adhesive.

Another object of the present invention is to create a novel method of electrically connecting an integrated circuit to a substrate including the sloped dielectric dam, which prevents short circuiting between two electrical connections between the integrated circuit and the substrate. The method of the present invention does not require precise application of a conducting adhesive, and as a result, the method may be formed quickly and cheaply, in order to produce the sloped dielectric dam, which prevents short circuiting. This object of the present invention is fulfilled by providing a method of electrically connecting a first member, including two conductive paths and a second member, including two conductive paths, said method comprising the steps of:

(a) forming a sloped dielectric dam between the two conductive paths of the second member; and (b) using an isotropically conductive adhesive to form two electrical connections between the two conductive paths of the first member and a corresponding one of the two conductive paths of the second member.

Another object of the present invention is to develop a novel method of maskless imaging of a photoimagable dielectric on a transparent member in order to form a dielectric dam. This object of the present invention is fulfilled by providing a method of maskless imaging of a negative photoimagable dielectric on a transparent member including two opaque areas, said method comprising the steps of:

(a) applying the negative photoimagable dielectric to an opaque area side (front side) of the transparent member; and (b) projecting light from a back side, through the transparent member to expose the negative photoimagable dielectric, residing between the two opaque areas, thereby imaging the negative photoimagable dielectric and forming a peak-shaped dielectric dam.

This object is also fulfilled by providing a method of electrically connecting a first member, including two conductive paths and a second transparent member, including two opaque conductive paths, said method comprising the steps of:

a) applying a negative acting photoimagable dielectric to a conductive path side (front side) of the second member;

b) projecting light from a back side, through the second member, to expose the negative acting photoimagable dielectric residing between the two opaque conductive paths, thereby forming a dielectric dam; and c) using an isotropically adhesive to form two electrical connections between the two conductive paths of the first member and a corresponding one of the two opaque conductive paths of the second member.

These and other objects of the present invention will become more readily apparent from the detailed description given hereinafter. However, it should be understood that a detailed description and specific examples, while indicating preferred embodiments of the invention are given by way of illustration, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow in the accompanying drawings, which were given by way of illustration only and thus are not limitative of the present invention, wherein.

DETAILED DESCRIPTION OF THE PREFERRED EMBODIMENT

The present application is directed to a novel apparatus including a peak-shaped dielectric dam and a method of manufacturing the peak-shaped dielectric dam, in order to minimize the possibility that conductive particles in a adhesive will form a short circuit between two electrical connections between an integrated circuit and a substrate. The present method for manufacturing the peak-shaped dielectric dam is fast and inexpensive, and therefore suitable for the mass production of electronic devices, which include numerous interconnections between integrated circuits and substrates.

Figure 5:
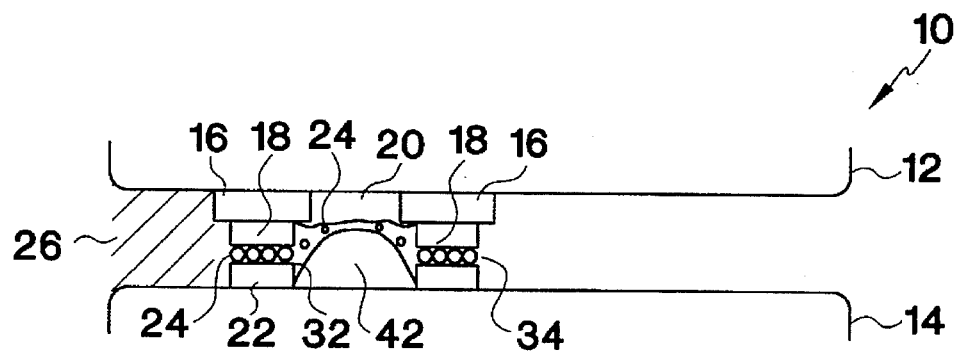
FIG. 5 illustrates the apparatus of the present invention in a preferred embodiment.

FIG. 5 illustrates a preferred embodiment of the present invention. In the electronic device 10, an integrated circuit 12 is attached to a substrate 14. The integrated circuit 12 includes aluminum pads 16 and gold bumps 18 and the substrate 14 includes patterns 22, which are to be electrically connected with the gold bumps 18, via the conductive particles 24 of the adhesive 26. In the preferred embodiment, a peak-shaped dielectric dam 42 is formed on the substrate 14 between the first electrical connection 32 and the second electrical connection 34, in order to minimize the possibility of a short circuit between the first electrical connection 32 and the second electrical connection 34. The shape of the peak-shaped dielectric dam 42 prevents conductive particles 24 from resting at the peak of the peak-shaped dielectric dam 42, and therefore minimizes the possibility of a short circuit.

In another preferred embodiment, the peak-shaped dielectric dam 42 is formed on the integrated circuit 12 instead of on the substrate 14. In another preferred embodiment, either the integrated circuit 12 or substrate 14 is a flip chip integrated circuit, a tape-automated bonded (TAB) integrated circuit, flexible circuit, a glass panel, a printed circuit board, a multi-chip module substrate, or a hybrid circuit substrate.

In another preferred embodiment of the present invention, the integrated circuit 12 is a liquid crystal display driver integrated circuit and the substrate 14 is a glass panel. In another preferred embodiment, the adhesive 26 is an anisotropically conductive adhesive.

Figure 6A:
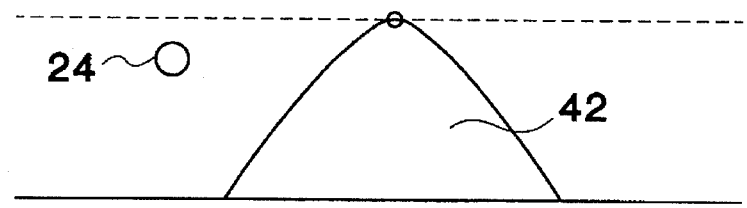
FIGS. 6(a) and 6(b) illustrate two examples of the shape of the peak-shaped dielectric dam illustrated in FIG. 5.
Figure 6B:
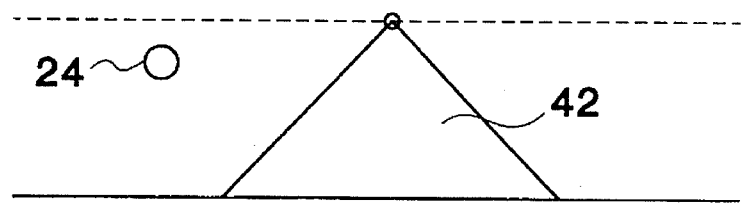

In another preferred embodiment of the present invention, the peak-shaped dielectric dam has a shape, as illustrated in FIGS. 6(a) or 6(b), such that one of the conductive particles 24 is prevented from resting at a peak of the peak-shaped dielectric dam 42, therefore minimizing the possibility of a short circuit.

In yet another preferred embodiment, the monosize conductive particles 24 are spherical or ovoid in shape. In yet another preferred embodiment, the monosize conductive particles 24 are irregular, rough-surfaced particles, or particles with flat surfaces.

In another preferred embodiment of the present invention, the adhesive 26 is an anisotropically conductive adhesive which includes conductive particles 24 which are monosize. In yet another preferred embodiment, the monosize particles have a diameter variance of ±10 µm or less and a particle distribution such that most of the monosize conductive particles 24 have diameters in this range.

In another embodiment, the peak-shaped dielectric dam 42 is formed such that a distance between a peak of the peak-shaped dielectric dam 42 and a passivation layer 20 on the integrated circuit 12, a particle distribution of the monosize conductive particles 24, and a shape of the monosize conductive particles 24 are selected, to ensure no short circuit is formed between the first electrical connection 32 and the second electrical connection 34.

Figure 1:
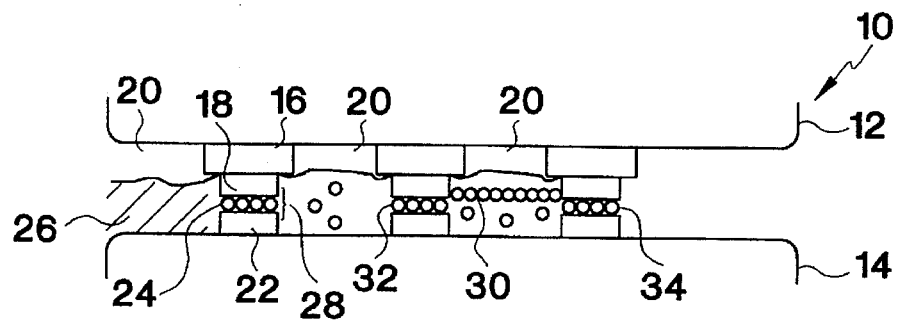
FIG. 1 illustrates a first conventional electronical device, which is subject to short circuiting.
Figure 2:
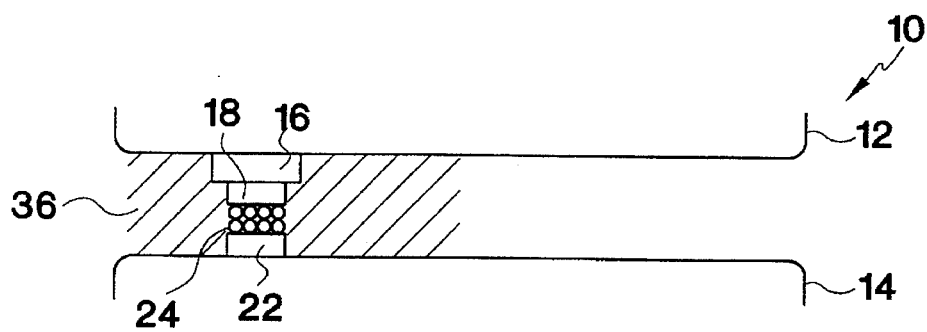
FIG. 2 illustrates a first conventional approach for solving the short circuiting problem illustrated in FIG. 1.
Figure 3A:
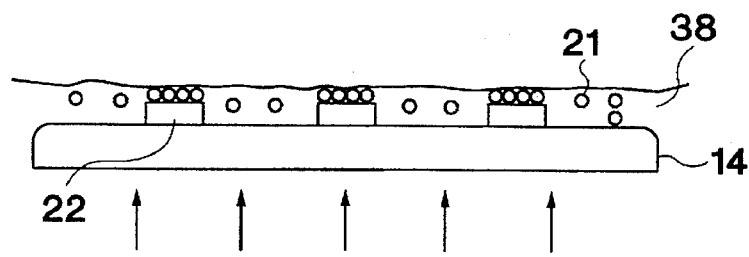
FIGS. 3(a)–3(b) illustrate a second conventional approach for solving the short circuiting problem illustrated in FIG. 1.
Figure 3B:
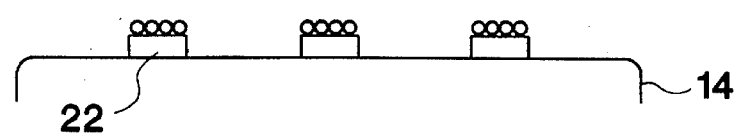
Figure 4:
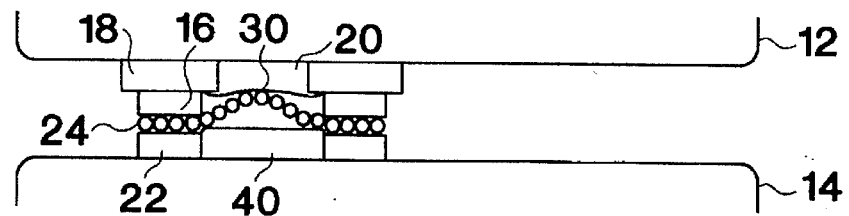
FIG. 4 illustrates a third conventional approach for solving the short circuiting problem illustrated in FIG. 1.

In yet another preferred embodiment of the present invention, a distance from a peak of the peak-shaped dielectric dam 42 to the first substrate, a particle distribution of the monosize conductive particles, and a shape of a monosize conductive particles are selected such that the peak-shaped dielectric dam fully insulates the two electrical connections 32 and 34 and prevents a short circuit. In the event that the integrated circuit 12 also includes a passivation layer 20 as illustrated in FIG. 1, then the distance from the peak of the peak-shaped dielectric dam 42 to the passivation layer 20 on the integrated circuit 12, the particle distribution of the monosize conductive particles, and the shape of a monosize conductive particles are selected such that the peak-shaped dielectric dam 42 fully insulates the first electrical connection 32 and the second electrical connection 34 and prevents a short circuit.

In the above-embodiment, it is physically impossible for one of the conductive particles 24 to reside between the peak of the peak-shaped dielectric dam 42 and the integrated circuit 12 or its passivation layer 20. As a result, the peak-shaped dielectric dam 42 fully insulates the first electrical connection 32 from the second electrical connection In another preferred embodiment of the present invention, a distance from the peak of the peak-shaped dielectric dam 42 to the integrated circuit 12 or a passivation layer 20 on the integrated circuit 12, the particle distribution of the monosize conductive particles, and the shape of a monosize conductive particles, and the shape of a monosize conductive particles are selected, so, although it may be physically possible for a particle to fit in the space between the peak of the peak-shaped dielectric dam 42 and the integrated circuit 12 or its passivation layer 20, the shape of the peak-shaped dielectric dam 42 reduces the possibility that one of the conductive particles 24 will reside at the peak of the peak-shaped dielectric dam 42, thereby reducing the possibility of a short circuit between the first electrical connection 32 and the second electrical connection 34.

In another preferred embodiment of the present invention, the peak of the peak-shaped dam 42 deforms when the integrated circuit 12 and the substrate 14 are placed together. This configuration also fully insulates the first electrical connection 32 from the second electrical connection 34.

Figure 7A:
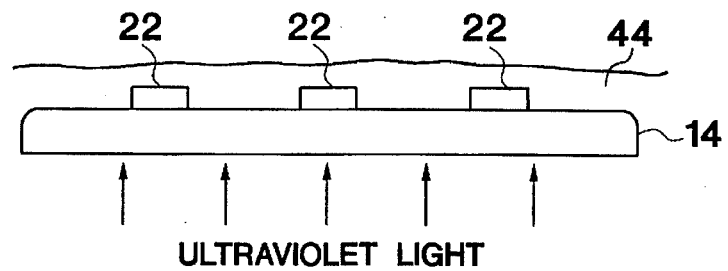
FIGS. 7(a) and 7(b) one embodiment for forming the peak-shaped dielectric dam illustrated in FIG. 5.
Figure 7B:
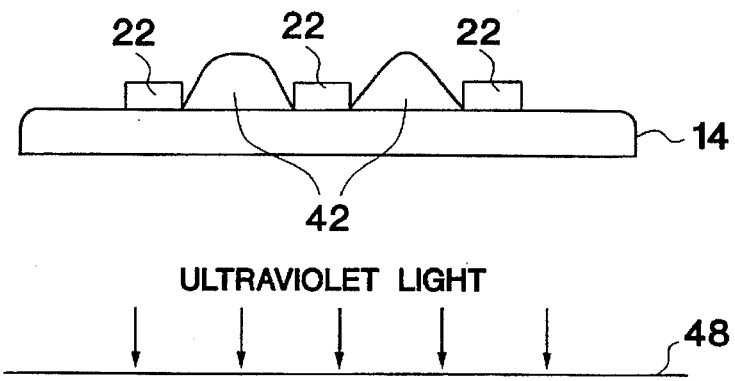

The present application is also directed to a method of manufacturing the peak-shaped dielectric dam illustrated in FIG. 5. As illustrated in FIG. 7(a), a negative acting photoimagable dielectric 44 is applied to a conductive path side or front side of the substrate 14. Light is then projected from an opposite side or back side of the substrate 14. The light exposes the negative acting photoimagable dielectric 44 residing between the patterns 22 on the substrate 14. The non-exposed negative acting photoimagable dielectric 44 on top of the patterns 22 is developed, leaving the structure illustrated in FIG. 7(b), including the peak-shaped dielectric dam 42.

Figure 8:
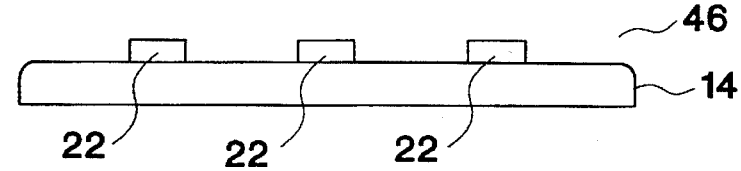
FIG. 8 illustrates another embodiment for forming the peak-shaped dielectric dam, illustrated in FIG. 5.

In another preferred embodiment, the peak-shaped dielectric dam 42 is formed, as illustrated in FIG. 8. A negative or positive acting photoimagable dielectric 46 is applied to a conductive path side or front side of the substrate 14. Light is then projected through a mask 48 to expose the negative or positive acting photoimagable dielectric 46, in order to form the peak-shaped dielectric dam 42.

Figure 9:
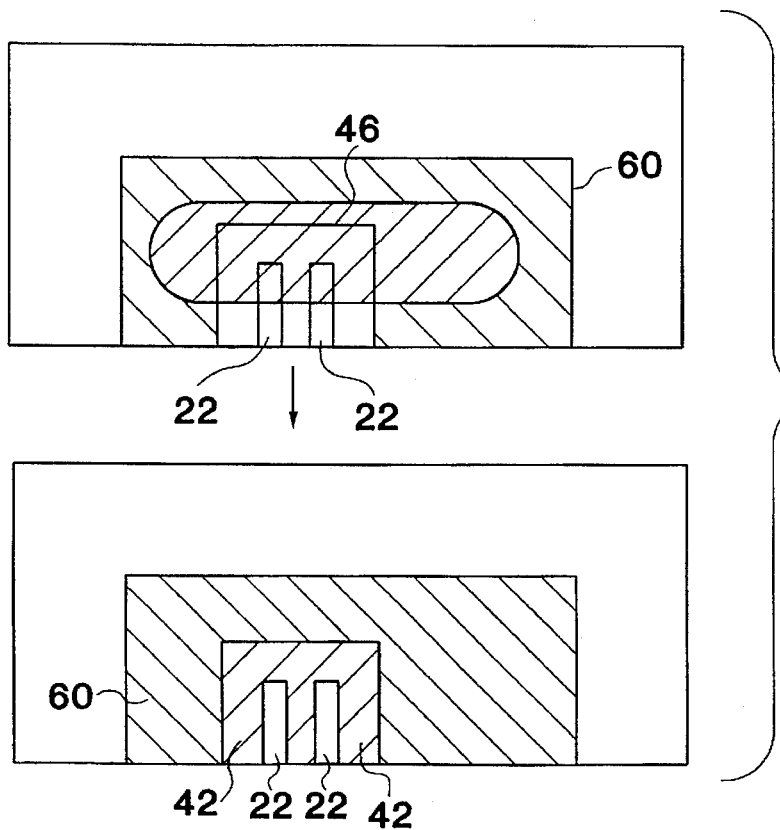
FIG. 9 illustrates another embodiment for forming the peak-shaped dielectric dam between a conductive path and a nonconductive path.

In the preferred embodiment illustrated in FIG. 5, each of the patterns 22 is a conductive path. However, a peak-shaped dielectric dam 42 may also be formed between one pattern 22 which is conductive and another opaque area which is either non-active and conductive or non-conductive. This embodiment is illustrated in FIG. 9. FIG. 9 illustrates two patterns 22 which are conductive on the substrate 14 as well as an opaque area 60. The negative or positive acting photoimagable dielectric 46 is placed on the opaque area 60 over portions of the patterns 22 which are conductive. The negative or positive acting photoimagable dielectric 46 is then exposed such that a peak-shaped dielectric dam 42 is formed between patterns 22 which are conductive and a peak-shaped dielectric dam 42 is also formed between the patterns 22 which are conductive and the opaque area 60. This opaque area 60 may be either a non-active conductive opaque area or a non-conductive opaque area.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

We claim:

1. An apparatus, comprising:

a first member, including at least two conductive paths;

a conductive adhesive;

a second member, including at least two conductive paths, each of the at least two conductive paths of said second member being connected to a corresponding one of the at least two conductive paths of said first member via said conductive adhesive, to form two electrical connections; and a peak-shaped dielectric dam, formed on said second member between said two electrical connections, wherein a top portion of the peak-shaped dielectric dam is peak-shaped.

2. The apparatus of claim 1, wherein said conductive adhesive is an anisotropically conductive adhesive, including monosize conductive particles.

3. The apparatus of claim 2, wherein a distance from a peak of said peak-shaped dielectric dam to said first substrate, a particle distribution of said monosize conductive particles, and a shape of said monosize conductive particles are selected such that said peak-shaped dielectric dam fully insulates said two electrical connections and prevents a short circuit.

4. The apparatus of claim 2, wherein a distance from a peak of said peak-shaped dielectric dam to said first substrate, a particle distribution of said monosize conductive particles, and a shape of said monosize conductive particles are selected such that said peak-shaped dielectric dam insulates said two electrical connections and reduces a possibility of a short circuit.

5. The apparatus of claim 2, wherein said peak-shaped dielectric dam deforms when pressed against said first member.

6. The apparatus of claim 2, wherein a shape of said peak-shaped dielectric dam prevents any of said monosize conductive particles from being positioned between a peak of said peak-shaped dielectric dam and said first member.

7. The apparatus of claim 1, wherein said first member and said second member are one a flip chip integrated circuit, a tape automated bonded (TAB) integrated circuit, a flexible circuit, a glass panel, a printed circuit board, a multi-chip module substrate, and a hybrid circuit substrate.

8. The apparatus of claim 1, wherein one of said first member is a liquid crystal display driver integrated circuit and said second member is a glass panel.

9. An apparatus, comprising:

a first member, including at least two conductive paths;

a conductive adhesive;

a second member, including at least two conductive paths, each of the at least two conductive paths of said second member being connected to a corresponding one of the at least two conductive paths of said first member via said conductive adhesive, to form two electrical connections; and peak-shaped dielectric means, formed on said second member between said two electrical connections, wherein a top portion of the peak-shaped dielectric means is peak-shaped.

10. The apparatus of claim 9, wherein said conductive adhesive is an anisotropically conductive adhesive, including monosize conductive particles.

11. The apparatus of claim 10, wherein a distance from a peak of said peak-shaped dielectric means to said first substrate, a particle distribution of said monosize conductive particles, and a shape of said monosize conductive particles are selected such that said peak-shaped dielectric means fully insulates said two electrical connections and prevents a short circuit.

12. The apparatus of claim 10, wherein a distance from a peak of said peak-shaped dielectric means to said first substrate, a particle distribution of said monosize conductive particles, and a shape of said monosize conductive particles are selected such that said peak-shaped dielectric means insulates said two electrical connections and reduces a possibility of a short circuit.

13. The apparatus of claim 10, wherein said peak-shaped dielectric means deforms when pressed against said first member.

14. The apparatus of claim 10, wherein a shape of said peak-shaped dielectric means prevents any of said monosize conductive particles from being positioned between a peak of said peak-shaped dielectric means and said first member.

15. The apparatus of claim 9, wherein said first member and said second member are one a flip chip integrated circuit, a tape automated bonded (TAB) integrated circuit, a flexible circuit, a glass panel, a printed circuit board, a multi-chip module substrate, and a hybrid circuit substrate.

16. The apparatus of claim 9, wherein one of said first member is a liquid crystal display driver integrated circuit and said second member is a glass panel.

* * * * *